US012647118B2

(12) United States Patent
Yap et al.

(10) Patent No.: US 12,647,118 B2
(45) Date of Patent: *Jun. 2, 2026

(54) SECTIONAL CONFIGURATION FOR PROGRAMMABLE LOGIC DEVICES

(71) Applicant: QuickLogic Corporation, San Jose, CA (US)

(72) Inventors: Ket Chong Yap, San Jose, CA (US); Chihhung Liao, Fremont, CA (US)

(73) Assignee: QuickLogic Corporation, San Jose, CA (US)

( * ) Notice: Subject to any disclaimer, the term of this patent is extended or adjusted under 35 U.S.C. 154(b) by 456 days.

This patent is subject to a terminal disclaimer.

(21) Appl. No.: 18/307,699

(22) Filed: Apr. 26, 2023

(65) Prior Publication Data

US 2023/0353156 A1 Nov. 2, 2023

Related U.S. Application Data

(63) Continuation of application No. 17/697,862, filed on Mar. 17, 2022, now Pat. No. 11,652,486.

(51) Int. Cl.
| | |
|---|---|
| *H03K 19/1776* | (2020.01) |
| *H03K 19/17704* | (2020.01) |
| *H03K 19/17736* | (2020.01) |

(52) U.S. Cl.
CPC ... *H03K 19/1776* (2013.01); *H03K 19/17708* (2013.01); *H03K 19/1774* (2013.01); *H03K 19/17744* (2013.01)

(58) Field of Classification Search
None
See application file for complete search history.

(56) References Cited

U.S. PATENT DOCUMENTS

| | | | |
|---|---|---|---|
| 5,388,065 A | 2/1995 | Yoneda | |
| 6,664,807 B1 * | 12/2003 | Crotty | G11C 7/1048 |
| | | | 326/39 |
| 2013/0073753 A1 * | 3/2013 | Matsushige | G11C 7/1051 |
| | | | 710/27 |
| 2017/0293518 A1 | 10/2017 | McLaury et al. | |

* cited by examiner

*Primary Examiner* — Anh Q Tran
(74) *Attorney, Agent, or Firm* — Seed Intellectual Property Law Group LLP

(57) ABSTRACT

A bit line (BL) may be coupled at a first end to a BL driver (BLD) and at a second end to a BL receiver (BLR). The BL include a plurality of sections and each BL section may be coupled to at least one corresponding sectional configuration memory latch controlled by: at least one sectional word line write (WLW-k) signal, which when asserted enables data to be written into the at least one corresponding sectional configuration memory latch when a corresponding tri-state-able sectional driver (SD-k) is activated, and at least one sectional word line read (WLR-k) signal, which when asserted enables data to be from the at least one corresponding sectional configuration memory latch when the corresponding sectional pull-up (PU-k) is activated.

20 Claims, 9 Drawing Sheets

100

110

305
Reset

302

310
WLW 330-1

WLW

155
BL 332-1
TG1

334

BL 330-3

360
Out 332-2
TG2

330-2

315
WLR

304

T1    g1

340-1

T2    g2

340-2

GND

306

V_DD

342
Rp

341
R1

350
Node A

320
Read
Enable

362
Sensing Block

500

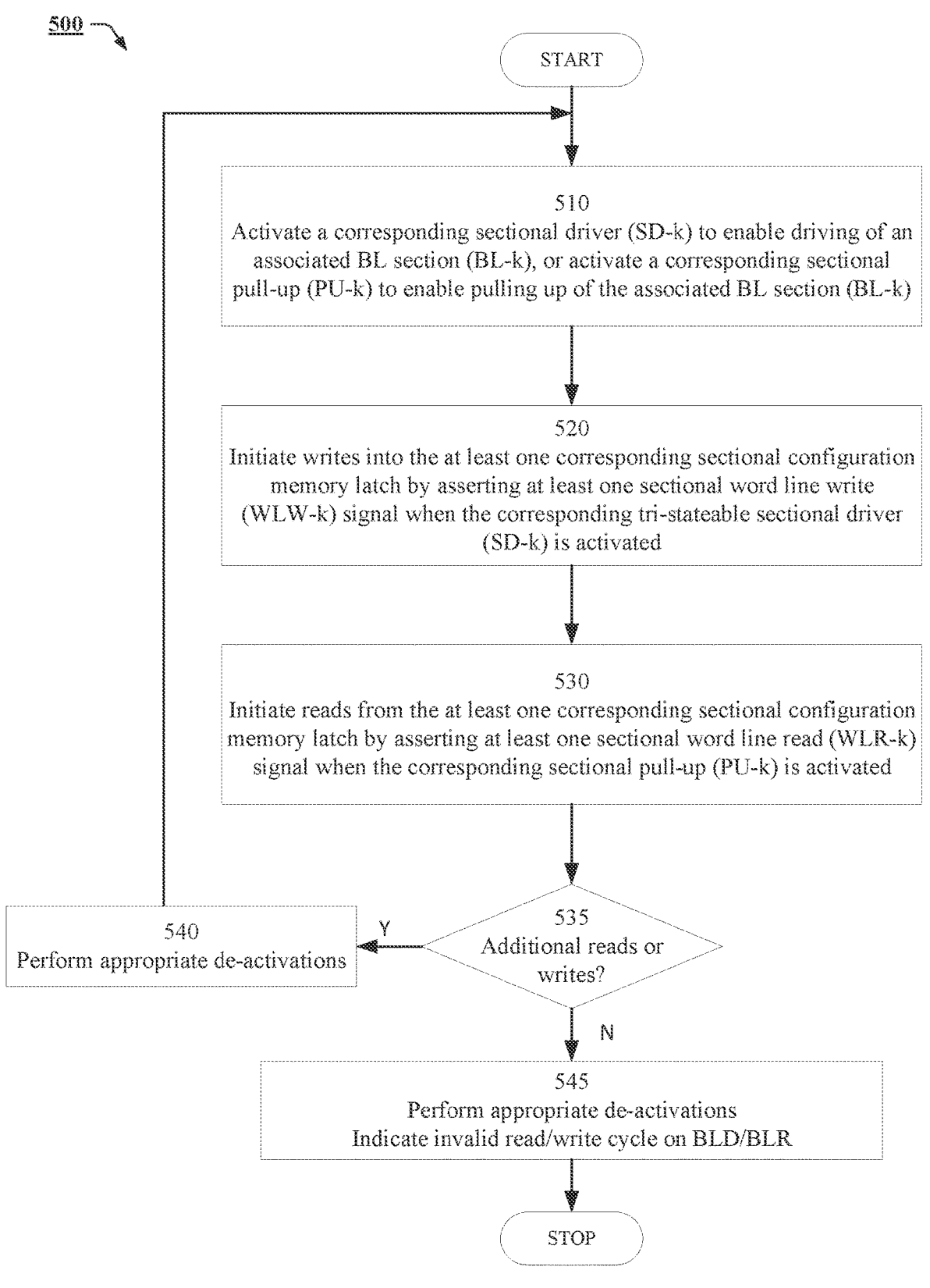

START

510
Activate a corresponding sectional driver (SD-k) to enable driving of an associated BL section (BL-k), or activate a corresponding sectional pull-up (PU-k) to enable pulling up of the associated BL section (BL-k)

520
Initiate writes into the at least one corresponding sectional configuration memory latch by asserting at least one sectional word line write (WLW-k) signal when the corresponding tri-stateable sectional driver (SD-k) is activated 530
Initiate reads from the at least one corresponding sectional configuration memory latch by asserting at least one sectional word line read (WLR-k) signal when the corresponding sectional pull-up (PU-k) is activated 535
Additional reads or writes?

Y

540
Perform appropriate de-activations

N

545
Perform appropriate de-activations
Indicate invalid read/write cycle on BLD/BLR

STOP

FIG. 5

SECTIONAL CONFIGURATION FOR PROGRAMMABLE LOGIC DEVICES

TECHNICAL FIELD

The present invention relates to an integrated circuit that includes a programmable logic device, such as a field programmable gate array, and to circuitry to facilitate sectional configuration of programmable logic devices.

BACKGROUND

The semiconductor industry is driven by a desire to provide higher levels of integration. With higher levels of integration, silicon space and cost are reduced while performance and reliability are increased. Unfortunately, higher levels of integration lead to greater specificity. For example, application specific integrated circuits (ASICs) are highly specific devices that often serve the needs of only one customer.

Programmable logic devices, such as field programmable gate arrays (FPGAs), are versatile integrated circuit chips, which have internal circuitry logic with user selected connections that a user can configure to realize user-specific functions. While programmable logic is versatile, there can be significant design challenges related to incorporating desired logic for a specified die size, routing signals, signal stability, etc. when large complex functions are mapped onto a silicon platform that includes programmable logic.

For example, FPGAs may use storage elements when routing through multiplexers ("muxes") or when defining a function via a look up table. Conventionally, the storage elements used are Static Random Access Memory (SRAM) cells, or registers SRAM cells may be distributed throughout the design and may take the form of an array, SRAM cells may be used to program FPGA routing interconnects and configurable logic blocks (CLBs) that are used to implement logic functions. While SRAM cells can be area-efficient, they are very foundry and process dependent and can cause considerable difficulties when migrating the FPGA product to a different process or a different foundry. On the other hand, while registers are available and can be implemented using standard cell libraries—they are not area efficient.

Conventionally, latches, which are much more area-efficient relative to registers, are not used as storage elements, in part, because of difficulties that can arise with the reading of latches.

Some disclosed embodiments enable the use of latches as storage elements thereby facilitating standardized area-efficient FPGA design.

SUMMARY

Some disclosed embodiments pertain to a programmable logic device (PLD) comprising: a bit line driver; a bit line receiver; and a bit line (BL), coupled at a first end to the BL driver and at a second end to the BL receiver. In some embodiments, the BL may comprise a plurality of BL sections, wherein each BL section (BL-k) is coupled to: a corresponding tri-stateable sectional driver (SD-k), wherein the corresponding sectional driver (SD-k) drives the associated BL section (BL-k) when the sectional driver (SD-k) is activated; a corresponding sectional pull-up (PU-k), wherein the sectional pull-up (PU-k) operates to pull up the associated BL section (BL-k) when the sectional pull-up (PU-k) is activated; and at least one corresponding sectional configuration memory latch. In some embodiments, the at least one corresponding sectional configuration memory latch may be controlled by: at least one sectional word line write (WLW-k) signal, which when asserted enables data to be written into the at least one corresponding sectional configuration memory latch when the corresponding tri-stateable sectional driver (SD-k) is activated; and at least one sectional word line read (WLR-k) signal, which when asserted enables data to be read from the at least one corresponding sectional configuration memory latch when the corresponding sectional pull-up (PU-k) is activated.

In another aspect, an integrated circuit (IC) may comprise a programmable logic device (PLD), wherein the PLD comprises: a bit line driver; a bit line receiver; and a bit line (BL), coupled at a first end to the BL driver and at a second end to the BL receiver, wherein the BL comprises a plurality of BL sections. In some embodiments, each BL section (BL-k) may be coupled to a corresponding tri-stateable sectional driver (SD-k), wherein the corresponding sectional driver (SD-k) drives the associated BL section (BL-k) when the sectional driver (SD-k) is activated; a corresponding sectional pull-up (PU-k), wherein the sectional pull-up (PU-k) operates to pull up the associated BL section (BL-k) when the sectional pull-up (PU-k) is activated, and at least one corresponding sectional configuration memory latch. In some embodiments, the at least one corresponding sectional configuration memory latch is controlled by: at least one sectional word line write (WLW-k) signal, which when asserted enables data to be written into the at least one corresponding sectional configuration memory latch when the corresponding tri-stateable sectional driver (SD-k) is activated, and at least one sectional word line read (WLR-k) signal, which when asserted enables data to be read from the at least one corresponding sectional configuration memory latch when the corresponding sectional pull-up (PU-k) is activated.

Some disclosed embodiments pertain to a method on a programmable logic device (PLD), wherein the PLD comprises a bit line (BL), coupled at a first end to a BL driver and at a second end to a BL receiver, and wherein the BL comprises a plurality of BL sections. In some embodiments, each BL section (BL-k) may be coupled to a corresponding tri-stateable sectional driver (SD-k), a corresponding sectional pull-up (PU-k), and at least one corresponding sectional configuration memory latch; and the method may comprise: performing one of: (a) activating a corresponding sectional driver (SD-k) to enable driving of an associated BL section (BL-k), or (b) activating a corresponding sectional pull-up (PU-k) to enable pulling up of the associated BL section (BL-k); and initiating writes into the at least one corresponding sectional configuration memory latch by asserting at least one sectional word line write (WLW-k) signal when the corresponding tri-stateable sectional driver (SD-k) is activated; or initiating reads from the at least one corresponding sectional configuration memory latch by asserting at least one sectional word line read (WLR-k) signal when the corresponding sectional pull-up (PU-k) is activated.

BRIEF DESCRIPTION OF THE DRAWINGS

Disclosed embodiments will be described, by way of example only, with reference to the drawings.

FIG. 5 shows a method 500 on a PLD, which may be used to perform sectional reads and writes in accordance with embodiments disclosed herein.

Like reference numbers and symbols in the various figures indicate like elements, in accordance with certain example embodiments. In addition, multiple instances of a functional element may be indicated by following a first number for the element with a letter or with a hyphen and a second number. For example, multiple instances of an element 155 may be indicated as 155-1, 155-2, 155-3 etc. In some instances, the suffixes may refer to the same element but in a different state and/or at a different time and/or associated with multiple other elements. When referring to such an element using only the first number, any instance of the element is to be understood (e.g. element 155 in the previous example would refer to elements 155-1, 155-2, and/or 155-3). Accordingly, in some instances, one or more suffixes may be omitted for readability and ease of description when the context is clear.

DETAILED DESCRIPTION

In the description, the terms "1", "one", "high", "logic 1", "logic one", and "logic high" refer to logic signal levels that are above some threshold voltage and sensed by logic circuitry to be a Boolean 1, whereas the terms "0", "zero", "low", "logic zero", "logic 0", "and "logic low" refer to logic signal levels that are below some threshold voltage and sensed by logic circuitry to be a Boolean 0. The term "asserted" refers to an activation of a signal (e.g., the signal is interpreted as being true without regard to the logic level of the signal in question), whereas the term "de-asserted" refers to an inactivation of a signal (e.g., the signal is interpreted as being false regardless of logic level of the signal in question).

Figure 1A:
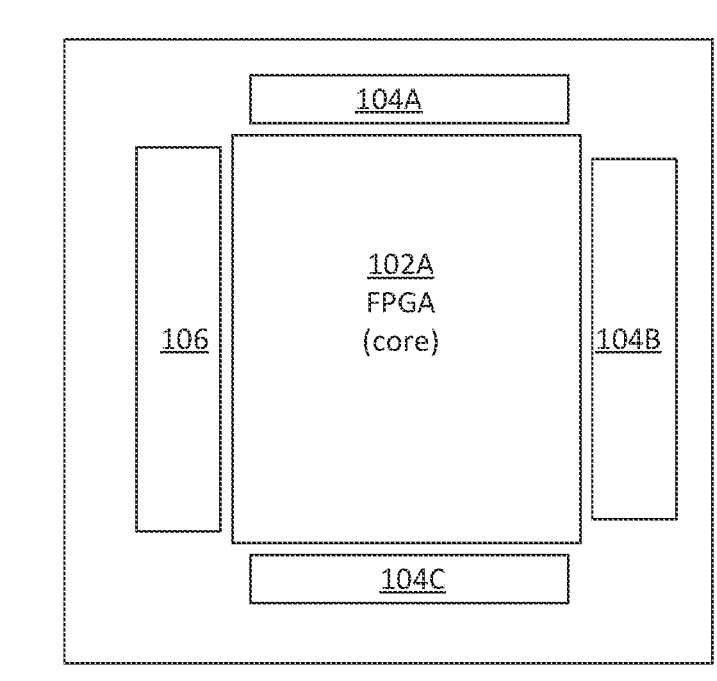
FIGS. 1A and 1B show simplified schematic of a programmable logic device (PLD) such as a field programmable gate array (FPGA) or other circuitry having user programmable circuit connections.
Figure 1B:
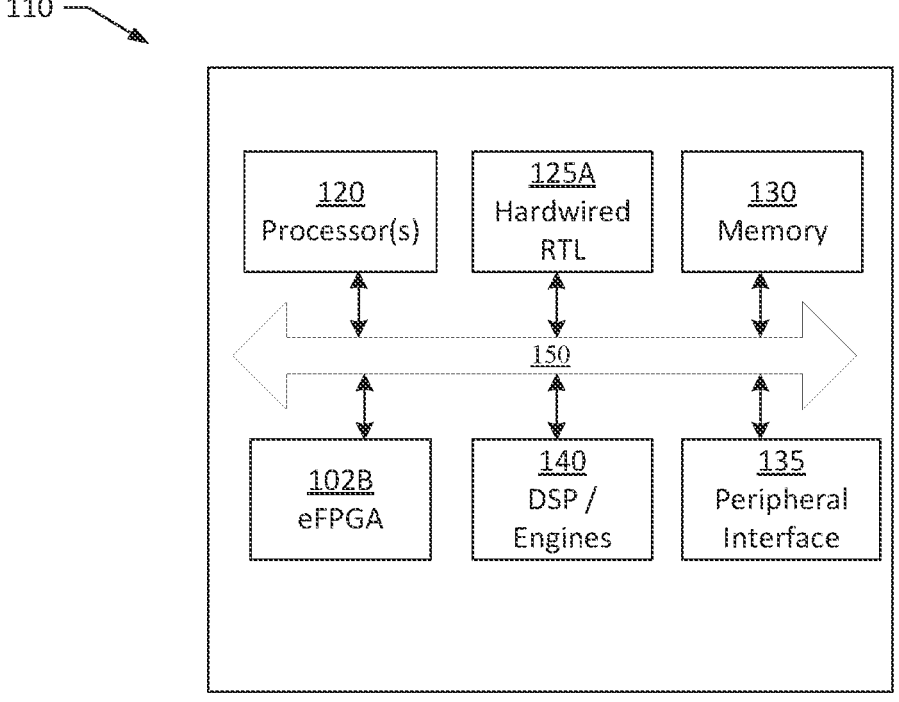

FIGS. 1A and 1B show simplified block diagrams of example Integrated Circuit (IC) chip 100 that may include programmable logic devices (PLD) 102 such as a field programmable gate array (FPGA) (e.g., 102A or 102B), and/or other circuitry having user programmable circuit connections. For simplicity and ease of description, the term "FPGA" may refer to any programmable logic device. Accordingly, while a programmable logic device described herein may be referred to as FPGA 102, it should be understood that other alternative types of programmable logic devices may also be used, such as Simple PLDs (SPLDs), Complex PLDs (CPLDs), Programmable Array Logic (PAL), etc.

As used herein, FPGA 102 may be a standalone FPGA 102A and/or take the form of an embedded FPGA (eFPGA)

102B. eFPGAs 102B may be viewed as fully integrated programmable logic Intellectual Property (IP) cores that form part of an ASIC or a System on a Chip (SoC). The term IP core refers to a reusable unit of logic, cell, circuit, or design element. IP cores are often licensed by an owning entity to another entity as a turnkey solution that provides some desired functionality. ASIC and/or SoCs with eFPGAs increase flexibility by facilitating combination of circuit/logic elements that that can be updated (e.g., associated with the eFPGA) with other elements of the ASIC/SoC.

As shown in FIG. 1A, a standalone Integrated Circuit (IC) chip 100 may include an FPGA core 102A. FPGA core 102A may be coupled to General Purpose Input/Output (GPIO) blocks 104 (shown as 104A, 104B, and 104C in FIG. 1A) and to one or more specific or dedicated interface blocks 106 (e.g., PCI Express, Ethernet, etc.). A standalone FPGA in the form of IC 100 may include various other blocks and/or logic/circuit elements (not shown in FIG. 1A) and may be coupled to other components on a circuit board using pins on IC 100.

FIG. 1B shows another example IC 110, which may include eFPGA 102B. IC 110 may be an ASIC or SoC and may include one or more processors (and/or processor cores) 120, hardwired register-transfer level (RTL) blocks, memory 130, Digital Signal Processor (DSP)/Engines block 140, and peripheral interface(s) 135. The blocks shown in FIG. 1B may be coupled using bus 150. For example, processor 120 and ISP/Engines block 140 may implement various application specific functions and additional customizations may be added using eFPGA 102B. In some embodiments, eFPGA 102 may be used to customize and/or accelerate machine learning applications, encryption schemes, etc., which may be implemented by Processor 120 and/or DSP/Engines block 140. As another example, eFPGA 102B may be used to implement and update functions or algorithms in the field (e.g., on deployed systems), or to address different markets (e.g., where each market may have one or more distinct requirements) using the same device (e.g., IC 110) Advantageously, integrated circuit 110, which incorporates eFPGA 102B, may provide a user with the functionality, ease-of-use, and high performance found in a dedicated device, such as an ASIC, as well as the configurability and flexibility found in programmable logic.

Figure 2A:
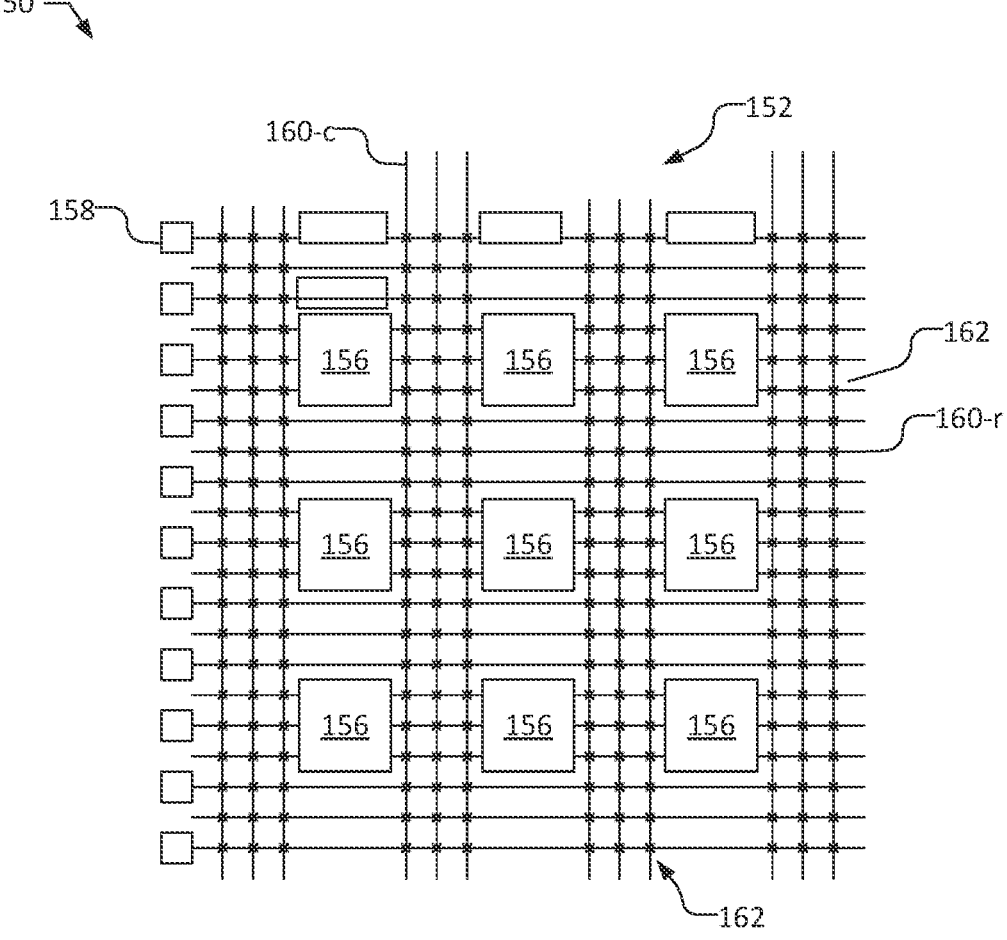
FIGS. 2A and 2B illustrate simplified schematics of a PLD in the form of an FPGA device such as the devices shown in FIGS. 1A and 1B.
Figure 2B:
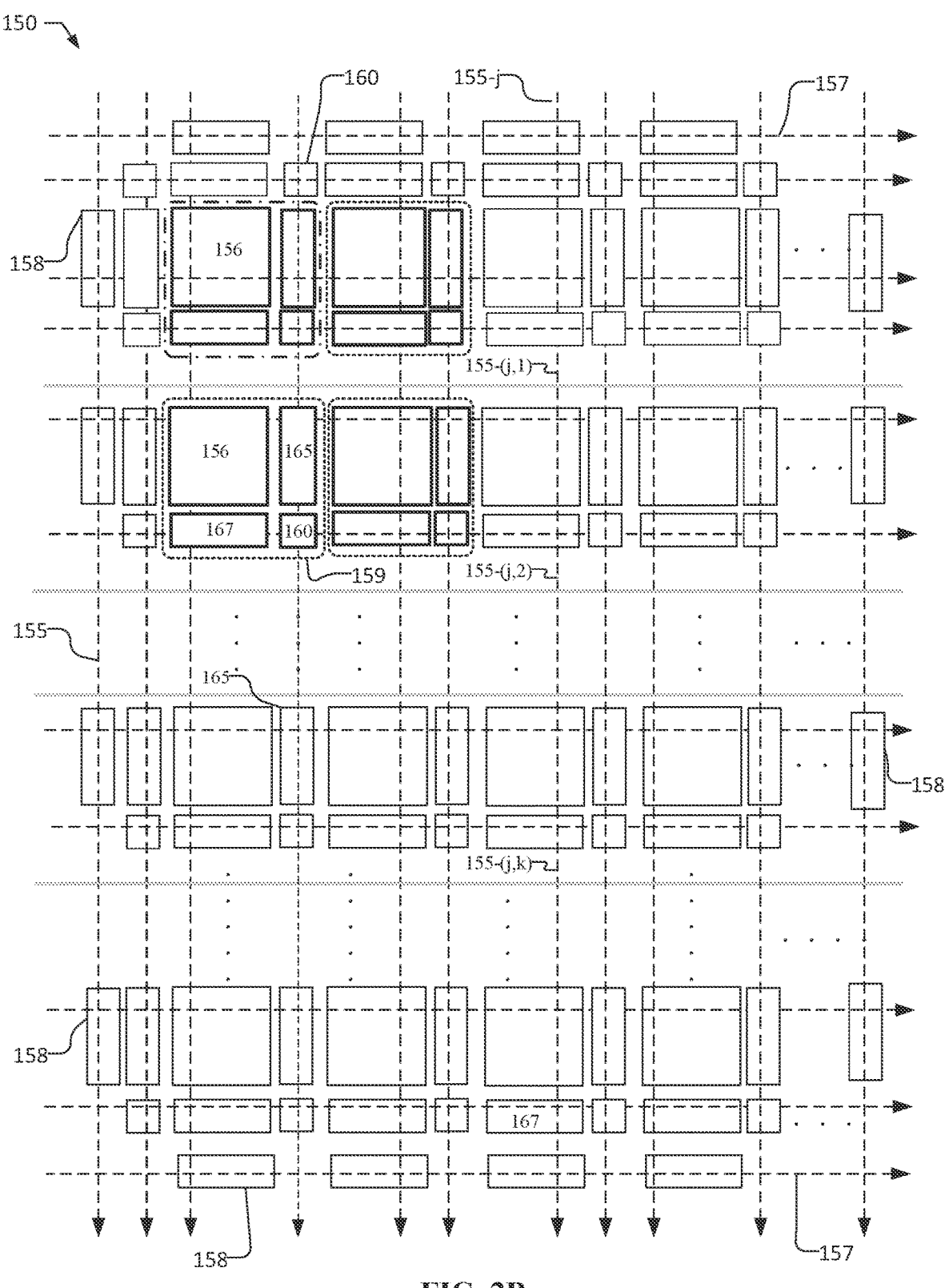

FIGS. 2A and 2B illustrate a simplified schematic of a PLD 150 in the form of an FPGA device (such as device 102A or 1021B of FIG. 1A or 1B). FPGA device 150 may include an array 152 of programmable elements and conductors 160. In some instances, SRAM, antifuses, registers, or D-Latches 162, (shown marked by "x" in FIG. 2A), may be used to selectively connect conductors (e.g., horizontal conductors 160-r) with other conductors (e.g., vertical conductors 160-c). In FIGS. 2A and 2B the terms "vertical" and "horizontal" and/or "rows" and "columns" are merely used herein to facilitate identification of described elements in reference to the figures.

The array 152 of programmable elements (FIG. 2A), which is sometimes referred to as a programmable fabric, or programmable routing fabric is connected to a number of configurable logic blocks (CLBs) 156. Each CLB 156 may include a number of look up tables (LUTs) and/or logic elements, which can be selectively combined to perform a desired function through the appropriate interconnection of conductors (e.g., by using D-latches 162). In some embodiments: the LUTs in CLBs 156 may be implemented using latches (such as configuration memory latch 300 shown in FIG. 3A). Each LUT may be viewed as emulating some combinational function so that when using the inputs of the combinational function as LUT address bits, the memory bit storing the value of the function for each particular input combination may be read at the output of the LUT. As one example, the output of the LUT may be coupled to a latch. A mux may select the latch output (sequential logic) or LUT output (combinational logic) as the output of CLB 156. The output of CLB 156 may be connected to programmable routing fabric 152.

Input/output (I/O) circuits 158 provide an interface to external circuitry, i.e., off-chip circuitry and may facilitate access to internal resources via pins.

FIG. 2B shows another simplified schematic of FPGA device 150 (such as 102A or 102B of FIG. 1A or 1B) illustrating some other FPGA device elements. In some embodiments, depending on the size of FPGA 150, each CLB 156 may include and/or be associated with a plurality of configuration memories (e.g., hundreds or thousands of configuration memories), which are distributed over a large silicon area. Thus, a reasonable sized FPGA 150 may include millions of configuration memory bits. The configuration memories may be accessed using BLs 155 and WLs 157.

Programmable routing resource 152 may include a routing resources CBX 167 in the horizontal direction and CBY 165 in the vertical direction. Programmable routing resource 152 may facilitate the configuration of programmable switches and wiring segments, which determines interconnection between CLBs Switch block (SB) 160 provides interconnections between the horizontal and vertical wire segments.

A CLB 156 and the associated CBX 167, CBY 165, and SB 160 (which are shown enhanced in FIG. 2B) are also referred to as a tile or logic tile 159 (shown within dashed blocks in FIG. 2B). As outlined above, Input/Output (I/O) circuits 158 (also referred to as General Purpose Input Output (GPIO) 158) may provide an interface to external off-chip circuitry and facilitate access to internal resources via pins.

Typically, BLs 155 and WLs 157 are made of a metal wire with the driver located in the FPGA array and/or along the perimeter. In some embodiments, as shown in FIG. 2B, a BL 155-$j$ may comprise bit line sections identified as BL 155-$j$, $k$), where BL section 155-($j$, $k$) identifies the k$^{th}$ section of the j$^{th}$ bit line. A BL section 155-($j$, $k$), which forms part of BL 155-$j$, may be coupled to a plurality of configuration memories, where each configuration memory may include a plurality of configuration latches (e.g., such as the configuration latch shown in FIG. 3A). In some embodiments, a BL section 155-($j$, $k$) may be associated with configuration memories that are coupled to: (a) a single WL 157, and (b) BL-section 155-($j$, $k$). In some embodiments, a BL section 155-($j$, $k$) may be associated with configuration memories that are coupled to (a) a plurality of WLs 157, and (b) BL section 155-($j$, $k$). The length of BL sections 1554$j$, $k$) may be based on circuit and/or chip parameters such as the effects of parasitic resistance, parasitic capacitance, degree to which false readings are to be minimized, power consumption, area available on the chip, operating environment characteristics, etc.

Figure 3A:
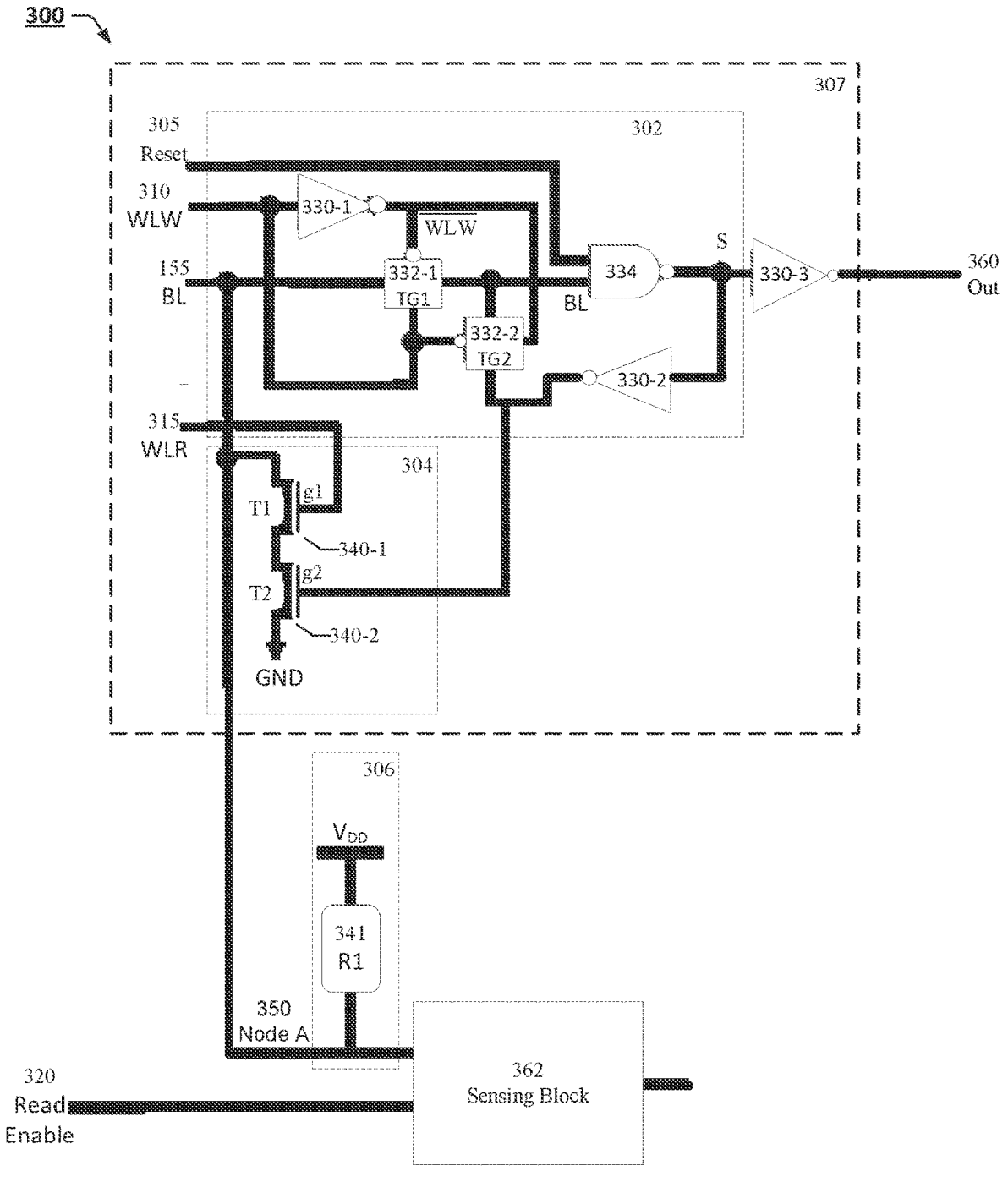
FIG. 3A shows a schematic of circuitry associated with a readable and resettable configuration latch with a non-terminated input.

FIG. 3A shows a schematic associated with an example readable and resettable configuration latch 300 with a non-terminated input. Configuration latch 300 is also referred to herein as configuration memory latch 300. While the operation of example configuration memory latch 300 is outlined below, configuration memory latch 300 is described in more detail in U.S. patent application entitled "CONFIGURATION LATCH FOR PROGRAMMABLE LOGIC DEVICES," filed concurrently herewith, which is incorporated by reference in its entirety herein.

Configuration memory latch 300 may form part of a programmable logic device, or a field programmable gate array (FPGA). A latch may be used to store data. In PLDs such as FPGAs, readability of stored latch data is desirable while also maintaining data integrity in the latches. The term non-terminated input refers to a latch input that is not coupled to a high impedance node (e.g., unbuffered latch input). In some embodiments, configuration memory latch 300 may be part of a configuration memory associated with a CLB 156 in FPGA 150. The configuration memory may include several configuration memory latch circuits 300. Configuration memory latch 300 shown in FIG. 3A may be used a with non-terminated (e.g., unbuffered) BL. 155, which can improve area efficiency. Because an FPGA may include several million configuration memories, latch based configuration memory (such as configuration memory latch 300) can be more area efficient Latch based configuration memory is also less susceptible to leakage when compared to register based configuration memory due to lower transistor counts. Further, SRAM type configuration memory is also more complex, whereas latch based configuration memories are typically available in standard cell libraries, thereby lowering development risk.

In FIG. 3A, the outer dashed circuit block 307 shows circuit elements that are repeated for each readable and resettable configuration memory latch (e.g., in one or more configuration memories), whereas circuit elements outside circuit block 307 may be common to a plurality of configuration memory latches (in one or more configuration memories).

For example, the circuitry in circuit block 307 may be repeated for each configuration latch in a configuration memory and there may a plurality of configuration memories coupled to BL 155. Further, as shown in FIG. 3A, a single weak pull-up 306 and a single sensing block 362 may be coupled to a BL 155. Thus, a single pull up 306 and a single sensing block 362 may be coupled to plurality of circuit blocks 307. Therefore, it is understood, when referring to configuration latch 300, in relation to FIGS. 3A and 3B, that a single pull up 306 and a single sensing block 362 coupled to a BL 155-$i$ may serve as a pull-up and a sensing block, respectively, for a plurality of circuit blocks 307 (in one or more configuration memories) that are coupled to the same BL 155-$i$.

In PLDs/FPGAs where a single metal wire (e.g., that may be used for a bit line or word line) serves a plurality of latches coupled to the wire, parasitic resistance and capacitance of the metal wire can present problems during write and/or read operations. The term parasitic capacitance refers to unwanted capacitance that may form between proximate circuit elements. For example, proximate electrical conductors with different voltages may store an electric charge ("parasitic capacitance") due to the electric field between the conductors. As the charge increases, there may be a corresponding decrease in current flow over the desired signal path that can negatively impact write timing. Similarly, conductors may exhibit unwanted parasitic resistance that dissipate power and have a negative impact on read functionality.

Non terminated input BL 155, may hold input data for write operations, with writes enabled by asserting WLW 310. BL 155 may also be used to sense data read from configuration latch 300, with reads enabled by asserting WLR 315. Inverter 330-1 inverts WLW signal 315. In FIG. 3A, in configuration latch 300, signals WLR 315 and WLW 310 are not both in an asserted state at any point in time. BL 155 is driving when WLW 310 is asserted and BL 155 is receiving when WLR 315 is asserted.

In the circuit of FIG. 3A, during write operations latched data reflects the state of BL 155. Accordingly (with WLW 310 asserted), when BL 155 is high, then a "I" is written, and when BL 155 is "0" then a "0" is written. However, during read operations, the state of BL 155 is the inverse of the latched data. Accordingly (with WLR 310 asserted), when the previously (stored) latched data is "0", BL 155 is high; and when the previously (stored) latched data is "1", BL 155 is low. Sensing block 362 may be configured to correctly read the latched data for a configuration memory bit based on the state of BL 155.

Configuration latch 300 may include a D-Latch 302, coupled to: (a) pull-down network 304, which, when activated, facilitates sensing "0" (on BL 155) by sensing block 362 during read operations, and (b) weak pull-up, which (when pull-down down network 304 is inactive) facilitates sensing "1" (on BL 155) by sensing block 362 during read operations. Data is written to latch 302 using input non-terminated BL 155 with WLW 310 asserted. Sensing block 362 senses data on BL 155 when WLR 315 and read enable 320 are both asserted. For example, sensing block 362 may comprise circuitry to sense the state ("U" or "0") of BL 155 during read operations when Read Enable signal 320 is asserted. As outlined previously, the state of BL 155 during read operations is indicative of the stored latched data being read.

Reading of latched data is facilitated by sensing block 362 based on the state (high or low) of BL 155 when WLR 315 and Read Enable 320 are both asserted. In some embodiments, sensing block 362 may be configured to output a 0 for a configuration memory bit when BL 155 is high, and output a 1 for the configuration memory bit when BL 155 is low. Writing of latch data is performed by asserting WLW 310 and holding BL 155 high, whereas writing 0 is performed by asserting WLW 310 and holding BL 155 low. During reads and in hold states, configuration memory latch 300 maintains stored data values thereby ensuring data integrity.

In FIG. 3A, reset line 305 is active low so that in normal operation reset line is held high (1). To reset configuration latch 300, reset line 305 is pulled low (0), which results in output of NAND gate 334 being 1. The output of NAND gate 334 is inverted by inverter 330-3 so that output 360 is 0, thus resetting configuration latch 300.

As shown in FIG. 3A, in configuration latch 300, the BL 155 input to transmission gate TG1 332-1 is not terminated, which eliminates input buffering and lowers latch transistor count in FIG. 3A, BL 155 is an in-out (bi-directional) signal, where BL 155 is driving when WLW 310 is active ("1"), and BL 155 is receiving when WLR 315 is active ("1"). In FIG. 3A, WLW 310 and WLR 315 cannot both be active simultaneously.

The output of D-latch 302 at Node S may be inverted by one or more inverters such as inverter 330-3 (shown in FIG. 3A), and used to drive output 360. In embodiments (such as FIG. 3A) that use single inverter 330-3, adequate driving capability may be ensured (e.g., to avoid crosstalk). In some embodiments, additional drivers may be used depending on the operating environment and other parameters such as size constraints. Further, the output of D-latch 302 at Node S may also be inverted by inverter 330-2, which is coupled to TG2 332-2 and to the gate input g2 of nMOS transistor 340-2.

When WLW 310 is active, TG1 332-1 is "On" and TG2 332-2 is in a high impedance state so that BL input 155 is written. During write operations (with WLW 310 active), timing issues can be managed with data stability on BL 155 being maintained over a time period beginning prior to assertion of WLW 310 and ending after the de-assertion of WLW 310 to ensure that data on BL 155 is latched and the write operation succeeds.

When reading, bus-keeping effected by weak pull-up R1 341, and/or precharge operations by programming logic circuitry may be used to condition BL 155. Because a read operation is being performed WLR signal 315 is active, while WLW signal 310 is inactive for the duration of the read operation. Prior to the assertion of WLR signal 315, BL signal 155 stays high because of the effect of weak pull up R1 341. As outlined previously, weak pull up R1 341 is placed on BL 155 furthest away from the detection circuits and serves to pull up BL 155 prior to the assertion of WLR signal 315. Weak pull up R1 341 is typically placed further away from the detection circuit (sensing block 362) to minimize the voltage drop across the metal wire (associated with BL 155) between the detection circuit and the D-latch 302. The voltage drop is caused by the current path from weak pull up R1 341 through nMOS transistors T1 340-2 and T2 340-2 of the read (pull-down) network.

When reading a "1", WLR 315 is active, WLW 310 is inactive, and the gate g2 of nMOS transistor T2 340-2 (FIG. 3A) will be at "1" (g2=1). Therefore, in pull down network comprising of the nMOS transistor stack T1 340-1 and T2 340-2, T1 340-1 is on (WLR=1), and T2 340-2 is on (g2=1) Accordingly. BL 155 is pulled to 0, and sensing block 362 may detect or be configured to output a "1" (representing the latched data). When WLR 315 is de-asserted following read, gate g1 of nMOS transistor T1 340-1 is 0, and T1 304-1 is turned off. Accordingly, weak pull up R1 341 operates to pull up BL 155 subsequent to the de-assertion of WLR 315. The output signal 360 stays at 1 ($V_{DD}$) throughout.

When the stored latch data that is to be read is "0", upon assertion of WLR 315, transistor T1 340-1 is on (gate g1 of transistor T1 340-1 is "1"), and, gate g2 of nMOS transistor T2 340-2 is "0." Accordingly, transistor T2 340-2 is off and BL 155 is pulled to 1 by weak pull up R1 341. As outlined previously, when BL 155 is pulled to 1, sensing block 362 (FIG. 3A) may detect or be configured to output a "0" (representing the latched data) corresponding to the stored configuration memory bit. Data is read during the assertion of WLR 315 (and Read Enable 320).

Figure 3B:
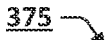
FIG. 3B shows a circuit, which models the example configuration memory latch circuit of FIG. 3A showing the effect of bit line parasitic resistance.

FIG. 3B shows a circuit 375, which models the example configuration memory latch circuit of FIG. 3A showing the effect of the parasitic resistance of BL 155. The parasitic resistance of 1B 155 is modeled by resistive load Rp 342. Circuit 375 operates in a manner similar to the circuit shown in FIG. 3A but the effect of parasitic resistance Rp 342 is described further below.

For example, there may be contention at Node A 350 during a read operation when latched data is 1 and WLR 315 is to be asserted. Prior to the assertion of WLR 315, gate g2 of T2 340-2 is 1 and weak pull-up 341 is active. Because of the parasitic resistance Rp 342 of BL 155, Rp 342 acts as a resistor divider at the input of sensing block 362. Therefore, when WLR 315 is asserted, because of effect of parasitic resistance Rp 342, node A may not be pulled down sufficiently, which may result in a false reading by sensing block 362. Thus, the parasitic resistance of BL 155 can introduce false readings in some instances. Indeed, as parasitic resistance Rp 342 increases, there is a greater likelihood of insufficient pull up and a consequent increase in the likelihood of a false reading by sensing block 362. Accordingly, techniques to reduce the impact of parasitic resistance and decrease the likelihood of false readings are desirable.

FIGS. 3A and 3B are merely examples to illustrate the effect of parasitic resistance on sensing circuitry. In general, contention at a node coupled to the weak pull-up and to sensing circuitry (e.g., caused by parasitic resistance) may increase the likelihood of false readings. In some embodiments disclosed herein, a sectional BL is introduced, which reduces the impact of parasitic effects and facilitates robust reads.

Figure 4A:
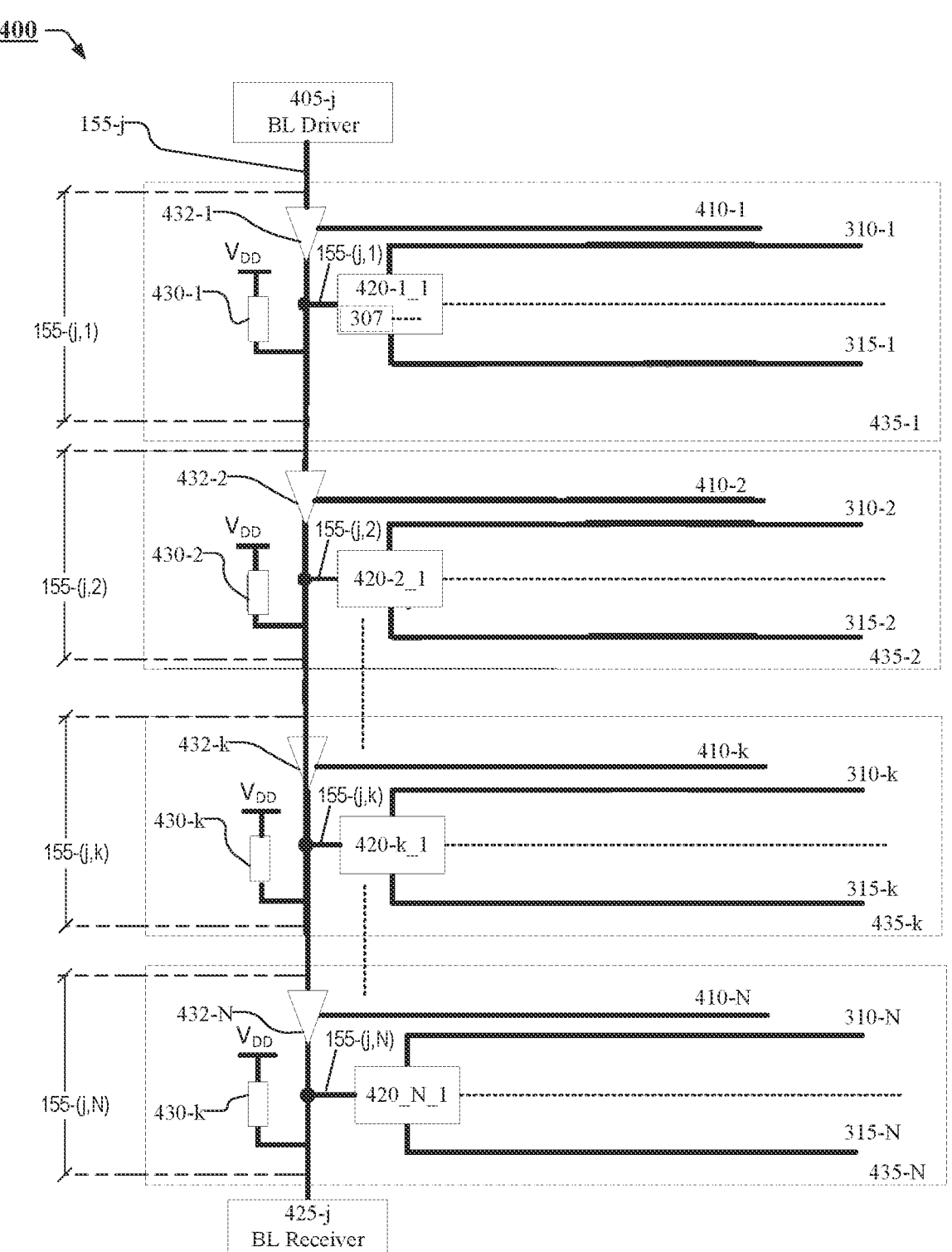
FIG. 4A shows a circuit schematic associated with a single BL comprising a plurality of BL sections, where each BL section is associated with a plurality of configuration sections.

FIG. 4A shows a circuit schematic 400 associated with a single BL 155-$j$ that includes a plurality of configuration sections 435-1 . . . 435-$k$ . . . 435-N ($1<k\leq N$), where each configuration section 435-$k$ is associated with a corresponding BL section 155-($j$, $k$).

As shown in FIG. 4A, configuration section 435-$k$ includes: (1) BL section 155-($j$, $k$), (2) pull up (PU-k) 430-$k$ coupled to BL section 155-($j$, $k$), (3) a plurality of sectional configuration memories 420-($k$, $l$) coupled to bit line section 155-($j$, $k$), and (4) tri-stateable sectional driver (SD-k) 432-$k$, where SD-k 432-$k$ is enabled by a sectional write line enable signal WLEN-k. Further, in some embodiments, the plurality of configuration memories 420-($k$, $l$) may comprise a plurality of configuration memory latches each with circuit block 307. The plurality of configuration memory latches may be coupled to a corresponding plurality of sectional WLWs and a plurality of corresponding sectional WLRs 315. As outlined previously, assertions of sectional WLW signals 310 and sectional WLR signals 315 do not overlap in time.

As outlined above, each configuration memory 420($k$, $l$) may include a plurality of configuration memory latches (e.g., configuration memory latch circuit shown with circuit block 307 in FIG. 3A). A configuration memory 420-($k$, $l$), in a section k, and configuration latches comprised within the configuration memory 420-($k$, $l$), may be served by a single bit line 155-$i$ (and/or bit line section 155-($j$, $k$)). Each configuration memory latch may also be coupled to a distinct WLW line 310 and a distinct WLR line 315. Accordingly, the plurality of configuration memory latches (e.g. in configuration memory 420-($j$, $k$)) may be served by (and coupled to) a plurality of WLW lines 310 and a plurality of WLR lines 315. For simplicity and ease of description, only a single WLW line and a single WLR line are shown for each section in FIG. 4A 10054J In FIGS. 4A-4C, references to configuration latch or configuration memory latch refer to configuration memory latch circuit blocks 307, which are coupled (in FIG. 4A) to sectional pull-up (PU-k) 430-$k$. Further, as shown in FIG. 4A, BL 155-$j$ is coupled to single BL driver (BLD-j) 405-$j$ and a single BL receiver (BLR-j) 425-$j$ for the entire BL 155-$j$.

During sectional writes for a section p (k=p), an SD-p 432-$p$ may be viewed as being in an activated state when WLEN-p signal 410-$p$ is asserted and all WLEN-k signals for $1<k<p$ between SD-p 432-$p$ and BL Driver (BLD) 405-$j$ are asserted. Assertion of WLEN-k signals for $1<k<p$ enables corresponding SD-k 432-$k$ for $1<k<p$. Further, when BLD 405-$j$ indicates a valid write cycle, assertion of sectional WLW signal 310-$k$ writes data to appropriate configuration memories 420 in configuration sections 435-$k$.

To illustrate sequential write operations (all WLR 315 signals are de-asserted), by way of one example method, (i) a counter k may be set to N (k=N) initially, where N is the number of configuration sections on BL 155-$j$. (ii) the signals WLEN[1:k] 410 may all be asserted to place SD-k 432-$k$ in activated state; (iii) WLW 310-$k$ may then be asserted and enable writes for configuration section 435-$k$;

(iv) once the write for configuration section 435-$k$ completes, WLEN-k 410-$k$ may be de-asserted; (v) k is then decremented. Steps (iii) to (v) are repeated until k=0. The example above that illustrates sequential sectional writes starting from configuration section 435-N and ending with writes to configuration section 1 435-1 is merely an illustration. The circuit shown in FIG. 4A may also facilitate arbitrary or random writes to any configuration section 435. For example, for writing to an arbitrary configuration section 435-$k$, signals WLEN [1:k] are all asserted (to place SD-k 432-$k$ in activated state) followed by the assertion of WLW 310-$k$. The state of signals W LEN [k+1:N] do not affect writes to configuration section 435-$k$.

During read operations (all WLW 310 signals are de-asserted) for a sectional configuration block 435-$p$ (k:=p), pull-up PU-p 430-$p$ may be viewed as being in activated state when (i) WLEN-p is de-asserted and (ii) signals WLEN [k:N] are asserted (for $p<k\leq N$), which corresponds to assertion of all WLEN-k signals between SD-p 432-$p$ and BLR 425-$j$. Further, when BLR 425-$k$ indicates a valid read cycle, assertion of the corresponding sectional WLR signal 315-$k$ reads data from the appropriate configuration memories 420 in configuration sections 435-$k$. The state of signals WLEN [1:p−1] do not affect reads to configuration section 435-$p$.

The circuit shown in FIG. 4A may also facilitate arbitrary or random reads to any configuration section 435. For example, for reading from an arbitrary configuration section 435-$k$, signal WLEN-k 410-$k$ is de-asserted, signals WLEN [k+1:N] are asserted (for $k+1\leq N$) (thereby activating PU 430-$k$), which is followed by the assertion of WLR 315-$k$. As outlined previously, in relation to FIG. 3A, the sectional weak pull-up 430-$k$ operates to pull-up BL section 155-($j$, $k$) so that data can properly sensed by sensing block 362. Because each BL section 155-($j$, $k$) exhibits lower parasitic resistance relative to the entire BL 155-$j$, parasitic effects can be mitigated and reading is robust.

Accordingly, in some embodiments, the circuit of FIG. 4A may form part of a PLD and may be viewed as comprising a bit line driver BLD-j (405-$j$), a bit line receiver BLR-j (425-$j$), a bit line BL-j 155-$j$, coupled at a first end to the BL driver BLD-j (405-$j$) and at a second end to the BL receiver BLR-j (425-$j$).

In some embodiments, the BL (155-$j$) may comprise a plurality of BL sections (e.g. BL 155-($j$, $k$)), which may be viewed as being between the first end of BL 155-$j$ and the second end of BL 155-$j$. Each BL section (e.g. 155-($j$, $k$)) is coupled to: (A) a corresponding tri-stateable sectional driver SD-k (e.g. 432-$k$), wherein the corresponding sectional driver SD-k (e.g. 432-$k$) is activated and drives the associated BL section (155-($j$, $k$)) when: (i) a corresponding sectional write line enable WLEN-k (410-$k$) signal is asserted and (ii) sectional write line enable signals (WLEN-[1:k−1]) between the corresponding BL section (155$j$, $k$)) and the BL driver BLD-j (405-$j$) are asserted; (B) a corresponding sectional pull-up PU-k (430-$k$), wherein the sectional pull-up PU-k (430-$k$) is activated and operates to pull up the associated BL section (155-($j$, $k$)), when: (i) a corresponding sectional write line enable WLEN-k 410-$k$ signal is de-asserted and (ii) the sectional write line enable signals (WLEN[k+1:N]) between the corresponding BL section (155-($j$, $k$) and the BL receiver (425-$j$) are asserted; and (C) at least one corresponding sectional configuration memory latch (e.g. 307) controlled by: (1) at least one sectional word line write WLW-k (310-$k$) signal, which when asserted enables data to be written into the at least one corresponding sectional configuration memory latch when the corresponding tri-stateable sectional driver SD-k (432-$k$)

is activated, and (2) at least one sectional word line read WLR-k (315-*k*) signal, which when asserted enables data to be from the at least one corresponding sectional configuration memory latch when the corresponding sectional pull-up PU-k (430-*k*) is activated. As outlined previously, assertion of the at least one sectional WLW signal (310-*k*) and assertion of the at least one sectional WLR signal (315-*k*) do not overlap in time.

Data is written into the at least one corresponding sectional configuration memory latch during valid BLD (405-*j*) write cycles. In some embodiments, the corresponding sectional driver SD-k (432-*k*) is activated prior to assertion of the at least one sectional word line write WLW-k (310-*k*) signal.

Data is read from the at least one corresponding sectional configuration memory latch during valid BLR (425-*j*) read cycles. In some embodiments, the corresponding sectional pull-up PU-k (430-*k*) is activated prior to assertion of the at least one sectional word line read WLR-k (315-*k*) signal.

In some embodiments, the at least one corresponding sectional configuration memory latch (307) may comprise at least one non-terminated input coupled to the sectional BL (155-*j, k*)). Further, the at least one corresponding sectional configuration memory latch may be resettable In some embodiments, the at least one corresponding sectional configuration memory latch (307) may form part of at least one sectional configuration memory (420). The reading and writing operations are described further in relation to FIGS. 4B and 4C below.

Figure 4B:
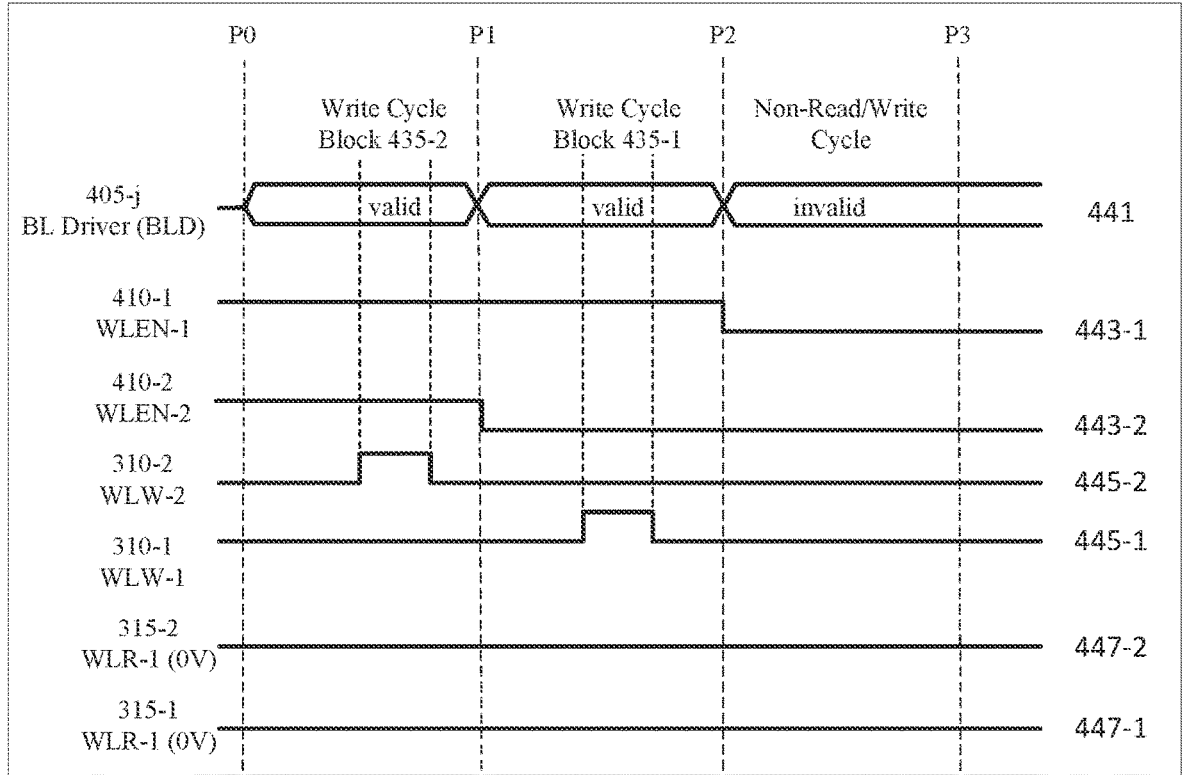
FIG. 4B shows waveforms associated with clock signal during a write operation for two configuration sections.

FIG. 4B shows waveforms associated with clock signal during a write operation for two configuration sections (e.g. 435-1 and 435-2) associated with a BL 155 comprising two sections (e.g. BL 155-*j*1 and 155-*j*2). Because FIG. 4B depicts write operations, all WLRs 315 are de-asserted, as shown by waveforms 447-1 and 447-2 for signals WLR-1 315-1 and WLR-2 315-2, respectively, which indicate de-assertion (e.g. at 0V) throughout. Further, write cycles occur when BLD 405-*j* indicates data is valid as shown in waveform 441.

From time P0 through P1, BLD 405-*j* indicates data is valid as shown in waveform 441. The period from P0 through P1 corresponds to a write cycle for configuration section 435-2. As outlined above, for writing to configuration section 435-2, all WLEN signals 410 between BLD 405-*j* and configuration section 435-2 are asserted (e.g. to activate sectional driver 432-2). Accordingly, from time P0 to P1, waveforms 443-1 and 443-2 for signals WLEN-1 410-1 and WLEN-2 410-2, respectively, indicate that the WLEN signals 410-1 and 410-2 are asserted. Signals WLEN-1 410-1 and WLEN-2 410-2 are asserted prior to the assertion of WLW-2 310-2. Accordingly, when WLW-2 310-2 (waveform 445-2) is asserted, BLD 405-*i* (waveform 441) indicates valid data, and WLEN-1 410-1 and WLEN 410-2 are both asserted (waveforms 443-1 and 443-2, respectively) so that data is written to a configuration memory 420_2 in configuration section 435-2.

From time P1 through P2, BLD 405-*j* indicates data is valid as shown in waveform 441. The period from P1 through P2 corresponds to a write cycle for configuration section 435-1. As outlined above, for writing to configuration section 435-1, all WLEN signals 410 between BLD 405-*j* and configuration section 435-1 are asserted. Accordingly, from time P1 to P2, waveform 443-1 for signal WLEN-1 410-1 indicates that the signal WLEN-1 410-1 is asserted. Signal WLEN-1 410-1 is asserted prior to the assertion of WLW-1 310-1. Accordingly, when WLW-1 310-1 (waveform 445-1) is asserted, BLD 405-*j* (waveform 441) indicates valid data, and WLEN-1 410-1 (waveform 443-1) is asserted so that data is written to configuration memory 420_1 in configuration section 435-1. In the example shown in FIG. 4B, waveform 443-2 shows that WLEN-2 410-2 is de-asserted at time P1. The de-assertion of WLEN-2 410-2 may serve as an indication that WLW-2 310-2 in configuration section 435-2 will not be activated. The state of WLEN-2 410-2 does not affect writes to configuration section 1 435-1 because configuration section 435-2 does not lie between BLD 405-*j* and configuration section 1 435-1.

From time P2 to P3, a non-read/write cycle occurs as indicated by waveform 441 for BLD 405-*j*. Accordingly, signals WLEN-1 410-1, WLEN-2 410-2, WLW-1 310-1, WLW-2 310-2, WLR-1 315-1, and WLR-2 315-2 are all de-asserted as shown by waveforms 443-1, 433-2, 445-1, 445-2, 447-1, and 447-2, respectively.

Figure 4C:
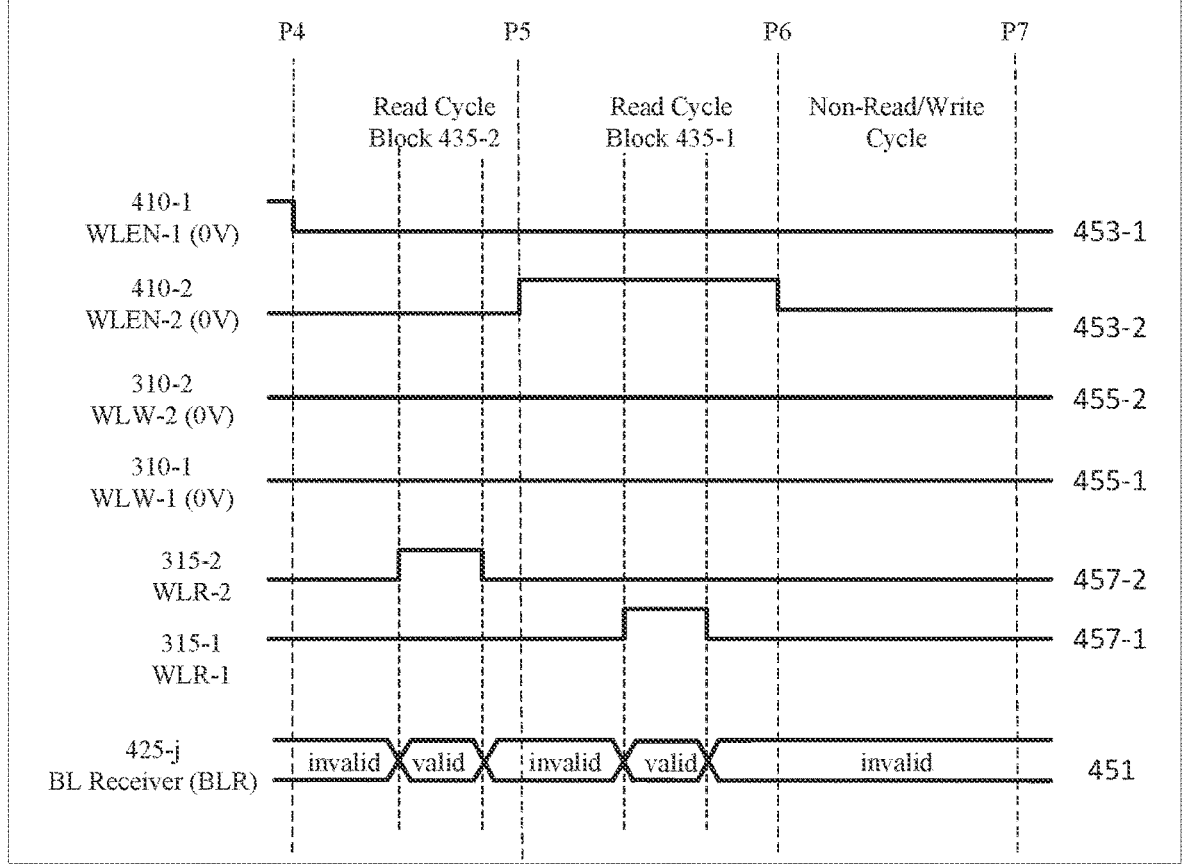
FIG. 4C shows waveforms associated with clock signal during a read operation for two configuration sections.

FIG. 4C shows waveforms associated with clock signal during a read operation for two configuration sections (e.g. 435-1 and 435-2) associated with a BL 155 comprising two sections (e.g. BL 155-1 and 155-2). Because FIG. 4C depicts read operations, all WLWs 310 are de-asserted, as shown by the waveforms 455-1 and 455-2 for signals WLW-1 310-1 and WLW-2 310-2, respectively, which indicate de-assertion (e.g. at 0V) throughout. Further, write cycles occur when BLR 425-*j* indicates data is valid as shown in waveform 451.

For a period between time P4 and P5, BLR 425 indicates data is valid as shown in waveform 451. This period (when BLR 425-*j* indicates data is valid) between P4 and P5 corresponds to a read cycle for configuration section 435-2. As outlined above, when reading configuration section 435-2, all WLEN signals 410 between configuration section 435-2 and BL receiver 425-*j* are asserted In the example shown in FIG. 4C, WLEN-2 is shown de-asserted. The de-assertion of WLEN-2 prevents BL section 155-*j*1 from affecting the reading of BL section 155-*j*2. Accordingly, when WLR-2 315-2 (waveform 455-2) is asserted, BLR (waveform 451) indicates valid data, and WLEN-2 410-2 is de-asserted (waveform 453-2) so that data is read from configuration memory 420_2 in configuration section 435-2 and sectional pull-up 430-2 is activated and operates to ensure that state changes on BL-j 155-*j* are correctly sensed.

In the example shown in FIG. 4C, waveform 453-1 shows that WLEN-1 is de-asserted from P4 to P5, during the read. However, the state of WLEN-1 410-1 will not affect reads to configuration section 2 because WLEN-1 410-1 does not lie between configuration section 435-2 and BLR 425-*j*. Accordingly, from time P4 to P5, waveforms 453-1 and 453-2 for signals WLEN-1 410-1 and WLEN-2 410-2, respectively, indicate that the signals are de-asserted. Signals WLEN-1 410-1 and WLEN-2 410-2 are de-asserted prior to the assertion of WLR-2 315-2.

For a period between time P5 through P6, BLR 425-*j* indicates data is valid as shown in waveform 451, The period from P5 through P6 corresponds to a read cycle for configuration section 435-1 and signal WLEN-1 410-1 stays de-asserted (which activates sectional pull-up 430-1). As outlined above, for reading from configuration section 435-1, all WLEN signals 410 between configuration section 435-1 and BLR 425-*j* are asserted. Accordingly, from time P5 to P6, waveform 453-2 for signal WLEN-2 410-2 indicates that the signal WLEN-2 410-2 is asserted. Signal WLEN-2 410-2 is asserted prior to the assertion of WLR-1 315-1.

Accordingly, when WLR-1 315-1 (waveform 455-1) is asserted, BLR 425 (waveform 451) indicates valid data, and WLEN-1 410-1 (waveform 443-1) is de-asserted, so that data is read from configuration memory 420_1 in configuration section 435-1.

From time P6 to P7, a non-read/write cycle occurs as indicated by waveform 451 for BLR 425-$j$. Accordingly, signals WLEN-1 410-1, WLEN-2 410-2, WLW-1 310-1, WLW-2 310-2, WLR-1 315-1, and WLR-2 315-2 are all de-asserted as shown by waveforms 453-1, 453-2, 455-1, 455-2, 457-1, and 457-2, respectively.

Accordingly, as outlined herein, the circuit shown in FIG. 4A, with configuration sections 435-$k$ corresponding to BL sections BL 155-($j$, $k$), where each BL section 155-($j$, $k$) is associated with a corresponding sectional pull-up 430-$k$ and a corresponding tri-stateable sectional buffer 432-$k$ controlled by a corresponding WLEN signal 410-$k$, operates to provide robust sensing of data in configuration memories 420.

FIG. 5 shows a method 500 on a PLD, which may be used to perform sectional reads and writes in accordance with embodiments disclosed herein. In some embodiments, method 500 may be performed on PLD 150.

In some embodiments. PLD (e.g. PLD 150) may comprise a bit line (BL) (e.g. BL 155), coupled at a first end to a BL driver (BLD) (e.g. BLD 405) and at a second end to a BL receiver (BLR) (e g. BLR 425), and wherein the BL (e g. BL 155) may comprise a plurality of BL sections (BL-k). In some embodiments, each BL section (BL-k 255-$k$) may be coupled to: a corresponding tri-stateable sectional driver (SD-k) (e.g. SD 432-$k$), a corresponding sectional pull-up (PU-k) (e.g. PU-k 430-$k$), and at least one corresponding sectional configuration memory latch (e.g. 307). The at least one section memory latch may form part of sectional configuration memory 420 (e g. 420-$k$).

In some embodiments, in method 500, in step 510, either: (a) a corresponding sectional driver (SD-k)(e.g. SD 432-$k$) may be activated to enable driving of an associated BL section (BL-k), or (b) a corresponding sectional pull-up (PU-k 430-$k$) may be activated to enable pulling up of the associated BL section (BL-k 155-$k$).

In some embodiments, in step 520, writes into the at least one corresponding sectional configuration memory latch may be initiated by asserting at least one sectional word line write (WLW-k) signal when the corresponding tri-stateable sectional driver (SD-k) has been activated (e.g. in step 510).

Alternatively, in some embodiments, in step 530, reads from the at least one corresponding sectional configuration memory latch may be initiated by asserting at least one sectional word line read (WLR-k) signal when the corresponding sectional pull-up (PU-k) has been activated (e.g. in step 510).

If additional read or write operations are being performed ("Y" in step 535), then, in step 540, appropriate deactivations may be performed in preparation for the next cycle.

Otherwise ("N" in step 535), if there are no further read or write operations, then, in step 545, appropriate deactivations may be performed and/or an invalid read/write cycle may be indicated on BLD 405 and/or BLR 425 and method 500 may terminate.

Although the present invention is illustrated in connection with specific embodiments for instructional purposes, the present invention is not limited thereto Various adaptations and modifications may be made without departing from the scope of the invention. Therefore, the spirit and scope of the appended claims should not be limited to the foregoing description.

14

What is claimed is:

1. A device, comprising:
a bit line driver;
a bit line receiver; and
a bit line (BL), coupled at a first end to the BL driver and at a second end to the BL receiver, wherein the BL is coupled to:
    a corresponding sectional driver, wherein the corresponding sectional driver is configured to drive the BL when the corresponding sectional driver is activated, and
    at least one corresponding sectional configuration memory latch controlled by:
        at least one sectional word line write signal, which when asserted is configured to enable data to be written into the at least one corresponding sectional configuration memory latch when the corresponding sectional driver is activated; and
        a sectional word line read signal.

2. The device of claim 1, wherein the BL is coupled to a corresponding sectional pull-up, wherein the corresponding sectional pull-up is configured to operate to pull up the BL when the sectional pull-up is activated.

3. The device of claim 2, wherein, when asserted, the sectional word line read signal is configured to enable data to be read from the at least one corresponding sectional configuration memory latch when the corresponding sectional pull-up is activated.

4. The device of claim 2, wherein the BL includes a plurality of BL sections.

5. The device of claim 4, wherein each BL section of the plurality of BL sections is coupled to the corresponding sectional driver, the corresponding sectional pull-up, and the at least one corresponding sectional configuration memory latch.

6. The device of claim 1, wherein the sectional driver is tri-stateable.

7. A device, comprising:
a bit line (BL); and
a plurality of configuration sections, each of the plurality of configuration sections comprising:
    a sectional driver coupled to the BL;
    a sectional pull-up coupled to the BL; and
    a sectional configuration memory coupled to the BL, to the sectional driver, and to the sectional pull-up, the sectional configuration memory being coupled to a sectional word line write (WLW) line and a sectional word line read (WLR) line.

8. The device of claim 7, wherein the BL includes a plurality of BL sections and each BL section is coupled to one of the plurality of configuration sections.

9. The device of claim 7, comprising, in each sectional configuration memory, at least one configuration memory latch.

10. The device of claim 9, wherein the sectional WLW line and the sectional WLR line are coupled to the configuration memory latch.

11. The device of claim 7, comprising a BL driver coupled to a first end of the BL and a BL receiver coupled to a second end of the BL.

12. The device of claim 7, wherein the sectional pull-up is deactivated when a sectional write line enable (WLEN) signal is asserted.

13. The device of claim 12, wherein the sectional pull-up is activated when the sectional WLEN signal is de-asserted.

14. A method, comprising:

activating a sectional driver to enable driving of a bit line (BL) by asserting a sectional write line enable (WLEN) signal, the sectional driver being coupled to the BL;

enabling a data writes procedure for a configuration memory by asserting a word line write (WLW) signal when the sectional driver is activated, the configuration memory being coupled to the BL, wherein an assertion of a word line read (WLR) signal cannot overlap with an assertion of the WLW signal; and de-asserting the sectional WLEN signal when the data writes procedure for the configuration memory has been completed.

15. The method of claim 14, wherein the configuration memory includes a configuration memory latch.

16. The method of claim 15, comprising enabling the data writes procedure for the configuration memory latch in the configuration memory.

17. The method of claim 14, wherein the BL includes a plurality of BL sections.

18. The method of claim 17, wherein the activating the sectional driver to enable driving of the BL includes asserting the sectional WLEN signal between the BL section and a BL driver, the BL driver being coupled to a first end of the BL.

19. The method of claim 14, wherein the activating the sectional driver occurs prior to the asserting the WLW signal.

20. The method of claim 14, comprising activating a sectional pull-up when the sectional WLEN signal is de-asserted.

\*  \*  \*  \*  \*